United States Patent
Tamura

(10) Patent No.: US 6,740,979 B1
(45) Date of Patent: May 25, 2004

(54) SEMICONDUCTOR DEVICE AND LSI DEFECT ANALYZING METHOD USING THE SAME

(75) Inventor: Itaru Tamura, Tokyo (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/349,927

(22) Filed: Jul. 8, 1999

(30) Foreign Application Priority Data

Jul. 9, 1998 (JP) .......................................... 10-193939

(51) Int. Cl.$^7$ .................. H01L 23/48; H01L 25/52; H01L 29/94
(52) U.S. Cl. .................. 257/776; 257/774; 257/296
(58) Field of Search .................. 257/774, 776, 257/296, 306

(56) References Cited

U.S. PATENT DOCUMENTS 5,107,459 A * 4/1992 Chu .......................... 365/63
5,789,791 A * 8/1998 Bergemont .................. 257/401
5,892,276 A * 4/1999 Miki et al. .................. 257/700

* cited by examiner

Primary Examiner—Amir Zarabian
Assistant Examiner—Kiesha Rose
(74) Attorney, Agent, or Firm—Finnegan, Henderson, Farabow, Garrett & Dunner, L.L.P.

(57) ABSTRACT

First wirings are disposed along a straight line in one row or one column of memory cell arrays. A second wiring is disposed above the first wirings and transmits a signal from one end of the second wiring to the other end thereof. Contact plugs connect the first wirings and the second wiring to each other. The first wirings are connected to a plurality of successive memory cells among all the memory cells in the row or column to which the first wirings belong. In case such an LSI is manufactured and defect analysis is made to thereby form an FBM, it is decided that the contact plugs connecting the first wirings to the second wiring are disconnected when a plurality of successive memory cells in one row or one column. Thus, a plurality of defects are expressed by the use of different categories.

5 Claims, 12 Drawing Sheets

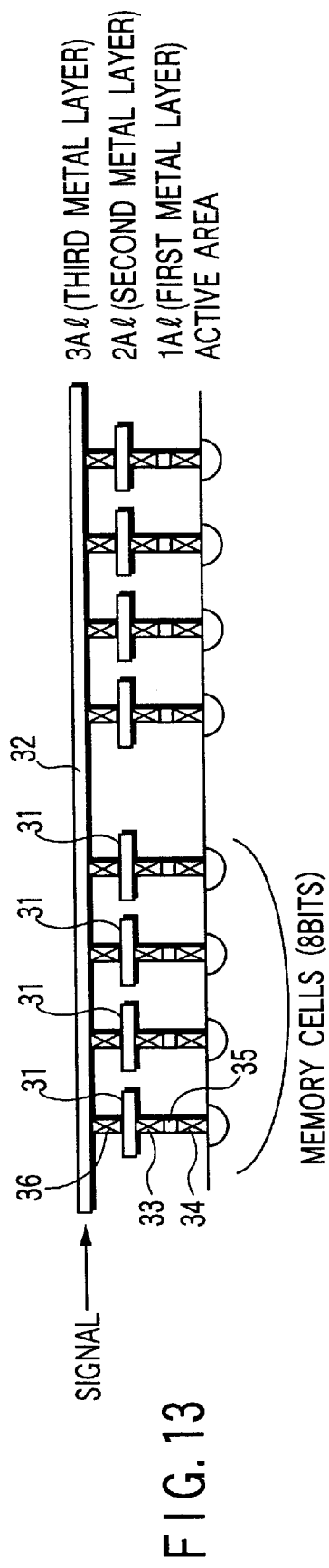
F I G. 13
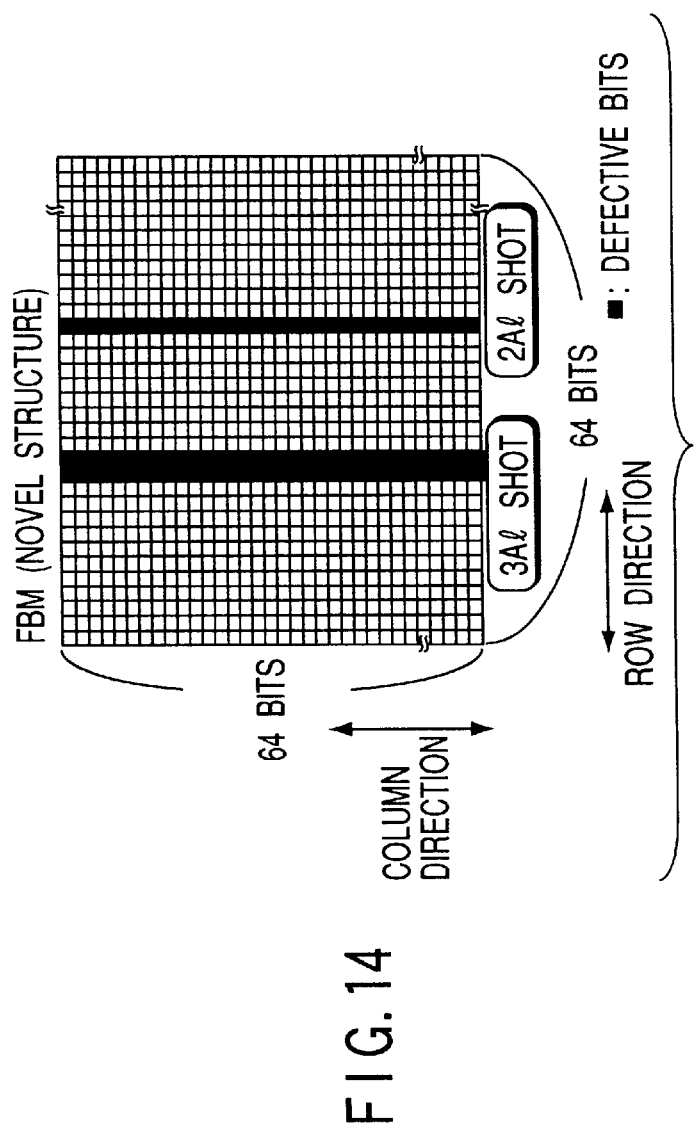
F I G. 14

SEMICONDUCTOR DEVICE AND LSI DEFECT ANALYZING METHOD USING THE SAME

BACKGROUND OF THE INVENTION

The present invention relates to a defect analyzing LSI having memory cells, which is used for periodic monitoring in factories.

Semiconductor products are manufactured through a manufacturing line comprising a series of steps of process, but, for some cause or other in connection with the manufacture, defective semiconductor products are manufactured in some cases. In such a case, it is necessary to clear up the cause for the defect and improve a portion of the process to thereby eliminate the cause for the defect (process feedback) and thus to enhance the manufacturing yield of the semiconductor products. However, in order to analyze the defective semiconductor products and clear up the cause for the defect, very difficult work must be carried out.

Thus, for the purpose of enhancing the manufacturing yield of semiconductor products, there is periodically manufactured an LSI for defect analysis by the use of the semiconductor product manufacturing line. Defect analyzing LSIs are manufactured in a predetermined number without stopping the semiconductor product manufacturing line.

The defect analyzing LSI is specially manufactured solely for defect analysis, so that the structure thereof is simple. Thus, in case a defect has taken place in the semiconductor products manufactured, this defect analyzing LSI is analyzed, whereby the specifying of the defective portion in which a defect has taken place and the clearing-up of the cause for the defect, etc. become easier as compared with the case where the actual semiconductor products are analyzed.

By the way, as the defect analyzing LSI, there is known the type which is constituted in such a manner that, shown in FIG. 19 and FIG. 20, memory cell arrays (such as SRAM cell array) 11 are formed on a chip or on the chip area of a wafer. In case of a defect analyzing LSI which has memory cell arrays, the specifying of a defective portion and the clearing-up of the cause for the defect can be more easily carried out by utilizing the so-called FBM (Fail Bit Map) system.

The FBM system mentioned here is a system constituted in such a manner that the positions of the respective memory cells in a memory cell array are represented in the form of meshes, and all the memory cells are tested, so that the position of a defective memory cell is shown in the map, whereby the specifying of the defective portion and the clearing-up of the cause for the defect are made on the basis of the disposition (category) of the defective memory cell.

The wiring structure of the defect analyzing LSI is contrived in such a manner that the disposition (categories) of defective memory cells and the defective locations or the causes for the defects correspond to each other at a rate of one to one.

Table 1 shows the relationship between the categories and the defective locations or the causes for the defects in case defect analysis is made of the defect analyzing LSI shown in FIG. 19 and FIG. 20.

TABLE 1

| Category | | Layer | Node 1 | Node 2 | o/s |
|---|---|---|---|---|---|
| 1 | Not applicable | Polycrystalline silicone | Word line | — | open |
| 2 | Not applicable | Contact plug (Poly-1Al) | Word line | — | open |
| 3 | Single-bit defect | Contact plug (SDG area) | Internal wiring | — | open |
| 3 | Single-bit defect | Contact plug (Poly-1Al) | Internal wiring | — | open |
| 3 | Single-bit defect | Polycrystalline silicone | Internal wiring | Internal wiring | short |

Poly: polysilicon
Al: alminum

The "category" mentioned here means the disposition (pattern) of the defective memory cells detected by the defect analysis. The "layer" means the layer in which a defect has taken place, "Node1" and "Node2" each mean the wiring in which a defect has taken place; both the "layer" and "Node1, 2" both specify the defective locations. The "o/s" means disconnection (open) or short-circuit (short), which specify the cause for a defect.

For example, (1) the disconnection of a word line (polycrystalline silicon layer) and (2) the disconnection of a contact plug (tungsten layer) which connects together a word line (polycrystalline layer) and a word line (first metal layer) correspond, respectively, to the disconnection of the polycrystalline silicon layer and the disconnection of a contact plug, which connects the polycrystalline silicon layer and the first metal layer to each other, in an actual semiconductor product (a logic circuit, a memory circuit or the like). However, even if the conventional defect analyzing LSI is analyzed by the use of the FBM system, these defects (disconnections) are not expressed in the form of categories.

More specifically, as shown in FIG. 21, in case of the conventional defect analyzing LSI structure, word lines (polycrystalline silicon layer) 12 and a word line (first metal layer) 13 lying above the word lines 12 both extend straight in the same direction, and they are both connected to each other at a plurality of locations by means of contact plugs 14. Further, a signal is inputted through one end of the word line (first metal layer) 13, and the other ends of the word lines (polycrystalline silicon layer, first metal layer) 12, 13 are dead ends, which are not connected to anything. Further, between the two contact plugs 14 adjacent to each other, 8 (bits) memory cells are connected to the word line (polycrystalline silicon layer) 12.

Thus, the memory cells are operated by the signal which propagates from the word line (first metal layer) 13 to the word lines (polycrystalline silicon layer) 12 via the contact plugs 14. Here, even if a disconnection has taken place in, e.g., the word lines (polycrystalline silicon layer) 12 or in the contact plugs 14, the memory cells operate without any trouble since the word lines (polycrystalline silicon layer) 12 and the word line (first metal layer) 13 are connected to each other by the plurality of contact plugs 14.

That is, as shown in FIG. 22, no category appears on the FBM, and thus, the disconnection in the word lines (polycrystalline silicon layer) and the disconnection in the contact plugs cannot be detected.

Further, in case of using a defect analyzing LSI having SRAM cell arrays (hereinafter referred to as a SRAM-TEG (Test Element Group)), the memory cells of the SRAM-TEG correspond to the memory cells formed in an actual semiconductor product (a logic circuit, a memory circuit or the like).

However, even if the conventional SRAM-TEG is analyzed by the use of the FBM system, (3) the disconnection of the contact plugs with respect to the active area (SDG area) of the SRAM cells, the disconnection of the contact plugs with respect to the polycrystalline silicon layer within the SRAM cells, and the short-circuit of the polycrystalline silicon layer within the SRAM cells all come out as belonging to utterly the same category (single-bit defect), so that these defects cannot be distinguished from one another.

More specifically, in case of the conventional SRAM-TEG structure, the respective SRAM cell (1 bit) is comprised of four MOS transistors T1 to T4 and two transfer transistors T5, T6 as shown in FIGS. 23 to 25. In FIG. 23 and FIG. 24, the transfer transistors T5, T6 are omitted. Further, in FIG. 24, the hatched portions are composed of, for example, a metal layer 1Al.

Here, the disconnection of a contact plug with respect to the active area (SDG area) of the SRAM cell, the disconnection of a contact plug with respect to the polycrystalline silicon layer within the SRAM cell, and the short-circuit of the polycrystalline silicon layer within the SRAM cell all result in disabling only one SRAM cell.

That is, even if any of the above-mentioned three types of defects has taken place, merely the category of "single-bit defect" appears on the FBM as shown in FIG. 26.

As stated above, conventionally, a defect analyzing LSI is periodically manufactured separately from semiconductor products to make defect analysis on the basis of this defect analyzing LSI, but, in case of the conventional defect analyzing LSI, there is the drawback that a defect cannot be detected, or a plurality of different defects appear under the same category, so that the specifying of a defective location and the clearing-up of the cause for the defect cannot be sufficiently made.

Further, recently, in semiconductor products, the wirings thereof are becoming more and more multi-layered; for example, in case of a conventional SRAM-TEG using two-layer wirings, it is very difficult to specify all the defective locations of a semiconductor product and/or clear up the causes for all the defects.

BRIEF SUMMARY OF THE INVENTION

The present invention has been made in order to solve the above-mentioned drawbacks, and it is an object of the invention to propose a defect analyzing LSI structure which can easily detect a plurality of different defects under different categories in case of periodically manufacturing a defect analyzing LSI having memory cells to make defect analysis by the use of an FBM system, whereby it becomes possible to easily specify defective locations or clear up the causes for the defects and easily effect a process feedback, thus contributing to the enhancement in the manufacturing yield of semiconductor products.

A defect analyzing semiconductor device according to the present invention comprises memory cell arrays, a plurality of first wirings disposed along a straight line in one row or one column of the memory cell arrays, a second wiring disposed above the plurality of first wirings for transmitting a signal from one end of the second wiring to the other end thereof, and a plurality of contact plugs which connect the plurality of first wirings to the second wiring, respectively, wherein the plurality of first wirings are each connected to a plurality of successive memory cells among all the memory cells in the row or the column to which the plurality of first wirings each belong.

A defect analyzing semiconductor device according to the present invention comprises memory cell arrays, a plurality of first wirings disposed along a straight line in one row or one column of the memory cell arrays, a plurality of second wirings disposed along a straight line above the plurality of first wirings, and a plurality of contact plugs which connect the plurality of first wirings and the plurality of second wirings to each other in such a manner that the plurality of first and second wirings are connected in series, wherein the plurality of first wirings are each connected to a plurality of successive memory cells among all the memory ells in one row or one column to which the plurality of first wirings each belong, and wherein a signal is transmitted from one end of the plurality of first wirings to the other end thereof.

A defect analyzing semiconductor device according to the present invention comprises memory cell arrays, two first wirings which are disposed in one column of the memory cell arrays, and to which signals complementary to each other are applied, two second wrings disposed above the two first wirings, and a plurality of contact plugs which connect one of the two first wirings to one of the two second wirings and connect the other of the two first wirings to the other of the two second wirings, wherein the two first wirings are connected to all the memory cells in the column to which the two first wirings each belong, and wherein the interval between the two first wirings is smaller than the interval between the first wiring in one of two columns adjacent to each other and the first wiring in the other column, while the interval between the two second wirings is smaller than the interval between the second wiring in one of two columns adjacent to each other and the second wiring in the other column.

A defect analyzing semiconductor device according to the present invention comprises memory cell arrays, two first wirings which are disposed in one column of the memory cell arrays and to which signals complementary to each other are applied, two second wirings disposed above or beneath the two first wirings, and a plurality of contact plugs which connect one of the two first wirings to one of the two second wirings and connect the other one of the two first wirings to the other one of the two second wirings, wherein the two first or second wirings are connected to all the memory cells in the column to which the two first or second wirings each belong, wherein the interval between the two first wirings is smaller than the interval between the first wiring in one of two columns adjacent to each other and the first wiring in the other column, while the interval between the two second wirings is larger than the interval between the second wiring in one of two columns adjacent to each other and the second wiring in the other column.

A defect analyzing semiconductor device according to the present invention comprises first and second MOS transistors which are connected in series between first and second power supplies and constitute a first inverter, third and fourth MOS transistors which are connected in series between the first and second power supplies, constitute a second inverter, and are flip-flop-connected to the first inverter, a first wiring which connects the drains of the first and second MOS transistors and the gates of the third and fourth MOS transistors to each other, and a second wiring which connects the drains of the third and fourth MOS transistors and the gates of the first and second MOS transistors to each other, wherein the contact portion between the drains of the first and second MOS transistors and the first wiring, the contact portion between the gates of the third and fourth MOS transistors and the first wiring, the contact portion between the drains of the third and fourth MOS transistor and the second wiring, and the contact portion between the gates of the first and second MOS transistors and the second wiring are each provided at two or more locations, and wherein a portion of the interval between the gates of the first and second MOS transistors and the gates of the third and fourth MOS transistors is set to a minimum work dimension.

A LSI defect analyzing method according to the present invention comprises the steps of manufacturing a semiconductor device by the use of a semiconductor product manufacturing line, forming an FBM by making tests on the memory cell arrays of the semiconductor device, and deciding that a plurality of contact plugs which connect a plurality of first wirings to a second wiring are disconnected when a plurality of successive memory cells in one row or one column are defective.

A LSI defect analyzing method according to the present invention comprises the steps of manufacturing a semiconductor device by the use of a semiconductor product manufacturing line, forming an FBM by making tests on the memory cell arrays of the semiconductor device, and deciding that a plurality of contact plugs which connect a plurality of first wirings and a plurality of second wirings to each other are disconnected when, under the assumption that a plurality of successive memory cells in one row or column constitute one unit, the memory cells n (natural number) times as many as the one unit (but the memory cells are smaller in number than all the memory cells in one row or one column) are defective.

A LSI defect analyzing method according to the present invention comprises the steps of manufacturing a semiconductor device by the use of a semiconductor product manufacturing line, forming an FBM by making tests on the memory cell arrays of the semiconductor device, and deciding that two first wirings or two second wirings are short-circuited when all the memory cells in one column are defective.

A LSI defect analyzing method according to the present invention comprises the steps of manufacturing a semiconductor device by the use of a semiconductor product manufacturing line, forming an FBM by making tests on the memory cell arrays of the semiconductor device, and deciding that the two first wirings in one column are short-circuited when all the memory cells in the one column are defective, and deciding that the two second wirings ranging over two columns which lie adjacent to each other in the row direction are short-circuited when all the memory cells in the two columns which lie adjacent to each other in the row direction are defective.

A LSI defect analyzing method according to the present invention comprises the steps of manufacturing a semiconductor device by the use of a semiconductor product manufacturing line, forming an FBM by making tests on the memory cell arrays of the semiconductor device, and deciding that a portion of the interval between the gates of first and second MOS transistors and the gates of third and fourth MOS transistors is short-circuited when a single-bit defect has taken place.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a schematic diagram showing a first embodiment of the structure of the word lines in the memory cell arrays shown in FIG. 1 and FIG. 2;

FIG. 13 is a sectional view, in the column direction, of the bit line shown in FIG. 12;

FIG. 14 is a schematic diagram showing the FBM in case the semiconductor device shown in FIG. 12 is used;

DETAILED DESCRIPTION OF THE INVENTION

Figure 1:
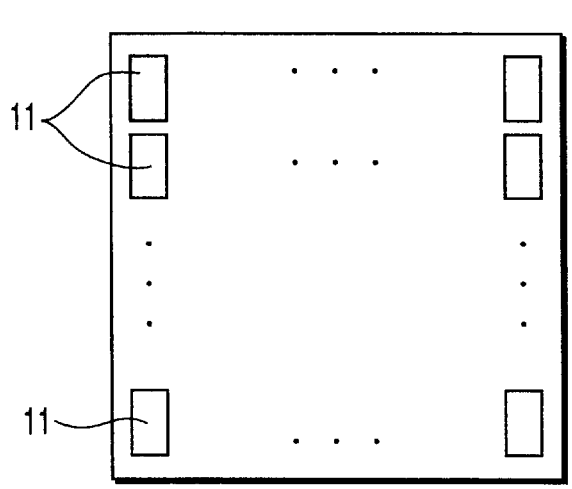
FIG. 1 is a schematic diagram showing an outline of the semiconductor device according to the present invention.

The semiconductor device according to the present invention and an LSI defect analyzing method using the same will now be described in detail with reference to the drawing.

FIG. 1 shows an outline of the semiconductor device according to the present invention.

This semiconductor device is comprised of a defect analyzing LSI formed in a chip or in the chip area of a wafer. The defect analyzing LSI, which is for analyzing the defect occurring in an actual semiconductor product (a logic circuit, a memory circuit, etc.) by the manufacture of the defect analyzing LSI in place of the actual semiconductor product, has a special structure.

Figure 2:
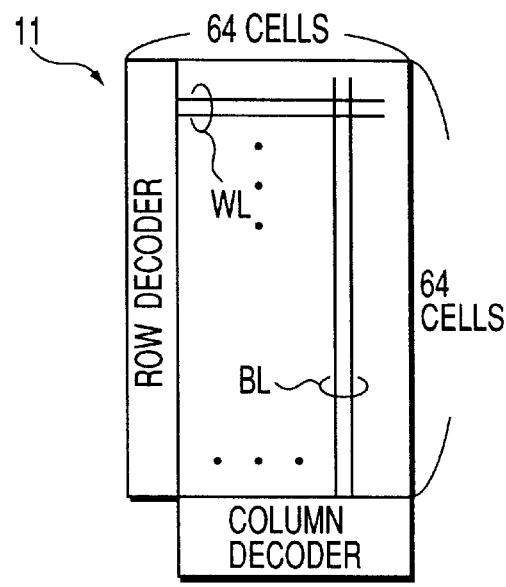
FIG. 2 is a schematic diagram showing a memory cell array shown in FIG. 1.

For example, the defect analyzing LSI has a plurality of (for example, 8×16) memory cell arrays (for example, SRAM cell arrays) 11. As shown in FIG. 2, the memory cell arrays 11 are each comprised of, for example, 64 (in the row direction)×64 (in the column direction) memory cells. A row decoder and a column decoder are provided for successively selecting the memory cells in the memory cell arrays.

FIG. 3 shows a first embodiment of the structure of the word lines formed in the memory cell arrays shown in FIG. 1 and FIG. 2.

The word line provided in one row is disposed along a straight line and comprises a plurality of (for example, 8) first wirings 12 extending in the row direction and a second wiring 13 disposed above the first wirings 12 and extending in the row direction. The plurality of first wirings 12 are comprised of a polycrystalline silicon layer, while the second wiring 13 is comprised of a first metal layer (for example, a first aluminum layer 1Al) provided above the polycrystalline silicon layer. The plurality of first wirings 12 are connected to the second wiring 13 through contact plugs (for example, a tungsten layer), respectively. To each first wiring 12, a plurality of (for example, 8) memory cells ranging in the row direction are connected.

Table 2 shows the relationship between the category and the defective locations or the causes for detects in case defect analysis is made, by the use of the FBM system, of a defect analyzing LSI which has word lines as shown in FIG. 3.

TABLE 2

| | Category | Layer | Node 1 | Node 2 | o/s |
|---|---|---|---|---|---|
| 2 | 8 continuous bits are deffective (1 row) | Contact plug (Poly-1Al) | Word line | — | open |

Poly: polysilicon
Al: alminum

Figure 4:
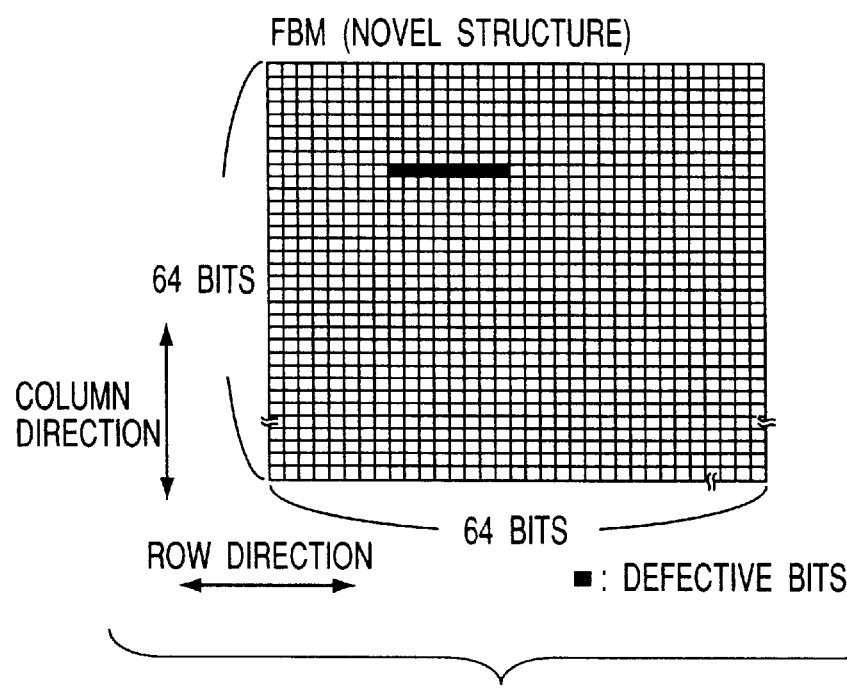
FIG. 4 is a schematic diagram showing an FBM in case the semiconductor device shown in FIG. 3 is used.

For example, in case of a defect analyzing LSI having the conventional structure (See Item 2 of Table 1), the disconnection of a contact plug which connects the polycrystalline silicon layer and the first metal layer to each other does not appear as belonging to any of the categories of the FBM system, but, in case of the novel structure (See Item 2 of Table 2), such disconnection is represented as the successive defects of a plurality of bits (for example, 8 bits) in one row (64 bits), as shown in the FBM of FIG. 4. That is, if one contact plug is disconnected, then the plurality of (for example, 8) memory cells connected to the contact plug cease to operate.

Thus, if, as shown in Item 2 of Table 2, the categories and defective locations or the causes for detects are correlated so as to correspond to each other at a rate of 1 to 1, then the absence or presence of a disconnection in the contact plugs which connect the polycrystalline silicon layer and the first metal layer to each other can be easily detected by the analysis of the defect analyzing LSI.

In this way, according to this embodiment, the structure of the respective word lines in the memory cell arrays are made into a special structure, that is, the first wiring comprised of a polycrystalline silicon layer is divided into a plurality of first wirings, and the first wirings thus formed are respectively connected to the second wiring comprised of a first metal layer via the contact plugs, whereby it becomes possible to detect the absence or presence of a disconnection in the contact plugs which connect the polycrystalline silicon layer and the first metal layer to each other.

Figure 5:
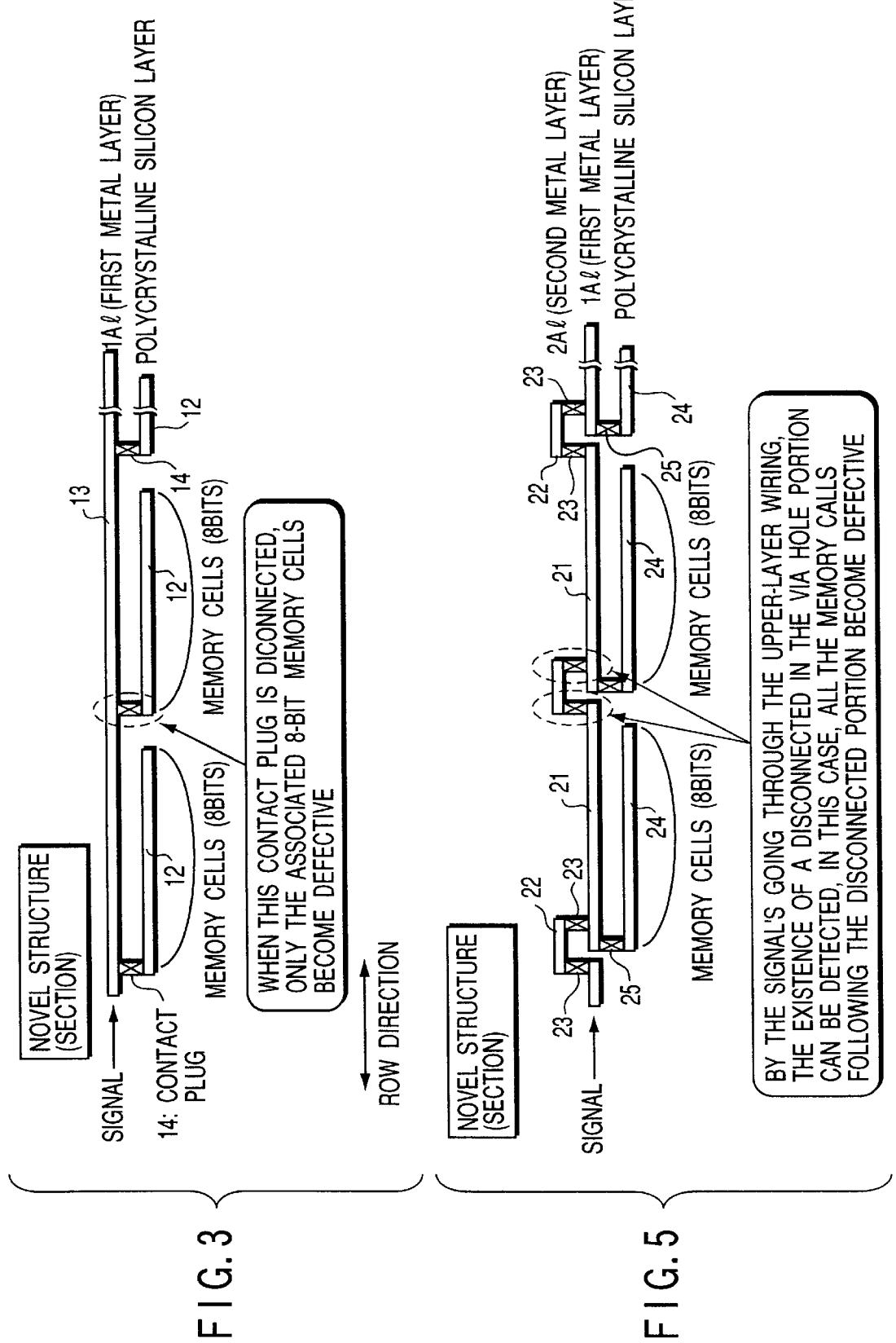
FIG. 5 is a schematic diagram showing a second embodiment of the structure of the word lines in the memory cell arrays shown in FIG. 1 and FIG. 2.

FIG. 5 shows a second embodiment of the structure of the word lines formed in the memory cell arrays shown in FIG. 1 and FIG. 2.

The word line provided in one row is disposed along a straight line in the one row and comprises a plurality of (for example, 8) first wirings 21 extending in the row direction and a plurality of (for example, 8) second wirings 22 disposed along a straight line above the first wirings 21, extending in the row direction. The plurality of first wirings 21 is composed of a first metal layer (for example, a first aluminum layer 1Al), while the plurality of second wirings 22 are composed of a second metal layer (for example, a second aluminum layer 2Al) above the first metal layer.

Contact plugs (for example, a tungsten layer) 23 connect the plurality of first wirings 21 and the plurality of second wirings 22 to each other in series, respectively.

Directly beneath the plurality of first wirings 21, a plurality of third wirings 24 are disposed extending in the row direction in such a manner as to correspond to the first wirings 21 at a rate of 1 to 1. The third wirings 24 are composed of a polycrystalline silicon layer provided beneath the first metal layer. Contact plugs (for example, a tungsten layer) 25 connect the plurality of first wirings 21 and the plurality of third wirings 24 to each other.

Further, to the plurality of third wirings 24, a plurality of (for example, 8) memory cells ranging in the row direction are connected.

Table 3 shows the relationship between the categories and the defective locations or the causes for defects in case defect analysis is made, by the use of the FBM system, of the defect analyzing LSI which has word lines as shown in FIG. 5.

TABLE 3

| | Category | Layer | Node 1 | Node 2 | o/s |
|---|---|---|---|---|---|
| 2 | 8 Continuous bits are deffective (1 row) | Contact Plug (Poly-1Al) | Word line | — | open |
| 4 | 8n (≦64) continuous bits are deffective (1 row) | Contact Plug (1Al-2Al) | Word line | — | open |

Poly: polysilicon
Al: alminum

Figure 6:
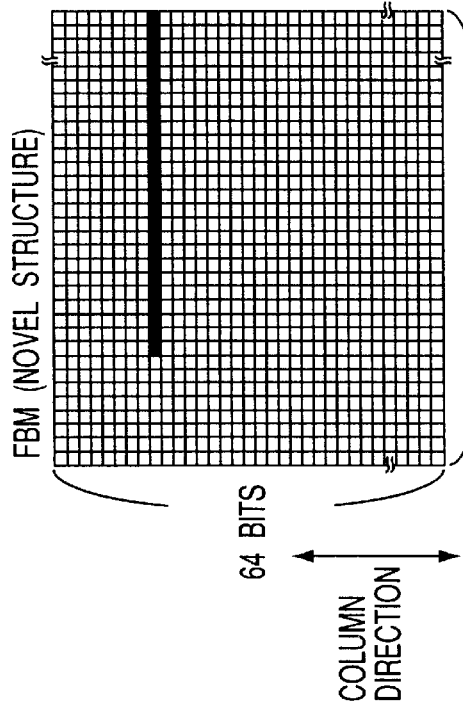
FIG. 6 is a schematic diagram showing the FBM in case the semiconductor device shown in FIG. 5 is used.

According to Item 4 of Table 3, the disconnection of the contact plugs connecting the first metal layer and the second metal layer to each other is expressed as the successive defects of 8n bits in one row (64 bits), as shown in the FBM of FIG. 6. Further, the number "8" in the expression "8n bits" corresponds to the number of the memory cells connected to one third wiring 24 (the above-mentioned number may alternatively be a number other than 8); in case one row consists of 64 bits, n stands for a natural number from 1 to 8, inclusive. That is, if a contact plug 23 which connects the first and the second metal layers to each other is disconnected, then the 8n memory cells connected to the word lines following the disconnected location cease to operate.

Thus, as shown in Item 4 of Table 3, if the category and the defective locations or the causes for defects are correlated so as to correspond to each other at a rate of 1 to 1, then the absence or presence of a disconnection in the contact plugs connecting the first metal layer and the second metal layer to each other can be easily detected.

Further, this embodiment also includes the structure shown in FIG. 3, so that the disconnection in the contact plugs 25 which connect the polycrystalline silicon layer and the first metal layer to each other can also be represented in the form of a category of the FBM system. That is, in case of this embodiment, the defects under two categories can be detected by the use of the word lines in the memory cell arrays.

In this way, according to this embodiment, the word lines in the memory cell arrays are made into a special structure, that is, the first wiring 21 comprised of a first metal layer is divided into a plurality of wirings, and the respective first wirings 21 thus formed are connected in series by the contact plugs 23 and the second wirings 22, and therefore, the absence or presence of a disconnection in the contact plugs 23 which connect the first metal layer and the second metal layer can be detected.

Figure 7:
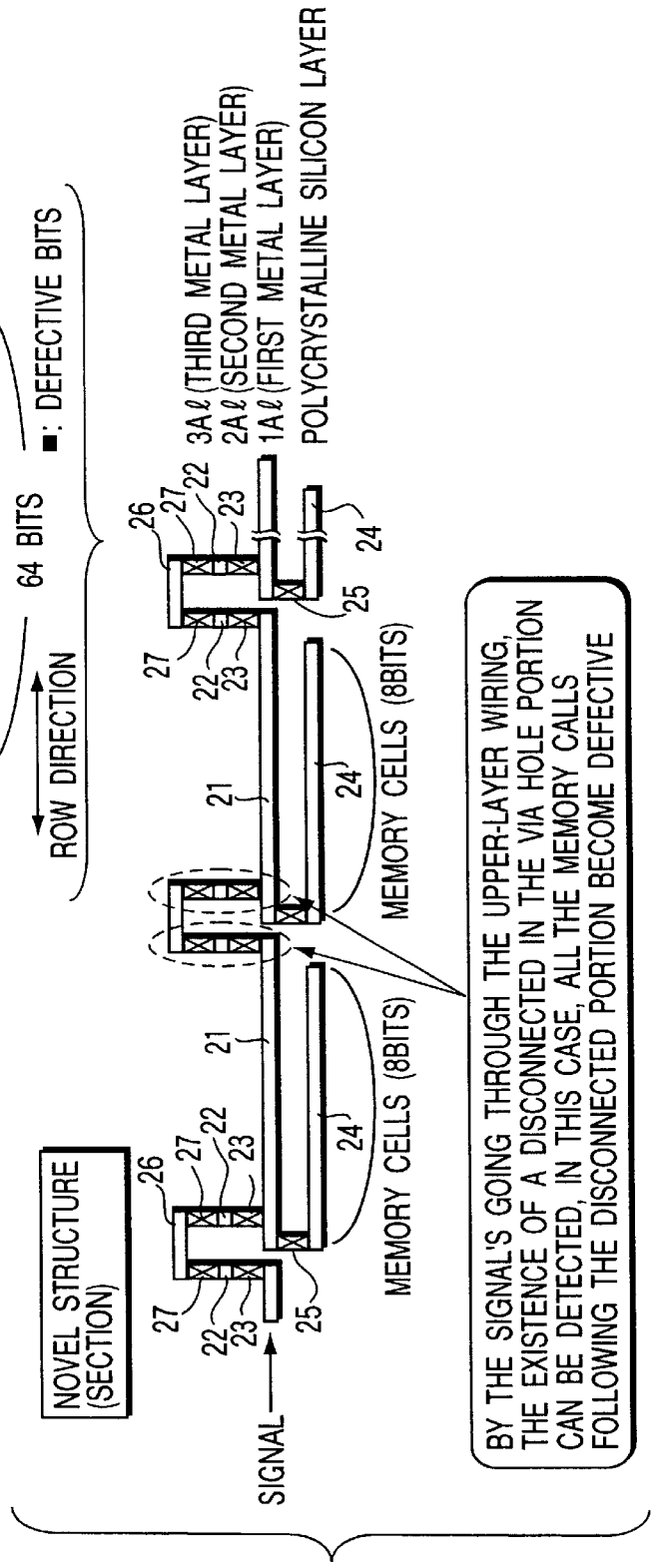
FIG. 7 is a schematic diagram showing a third embodiment of the structure of the word lines in the memory cell arrays shown in FIG. 1 and FIG. 2.
Figure 8:
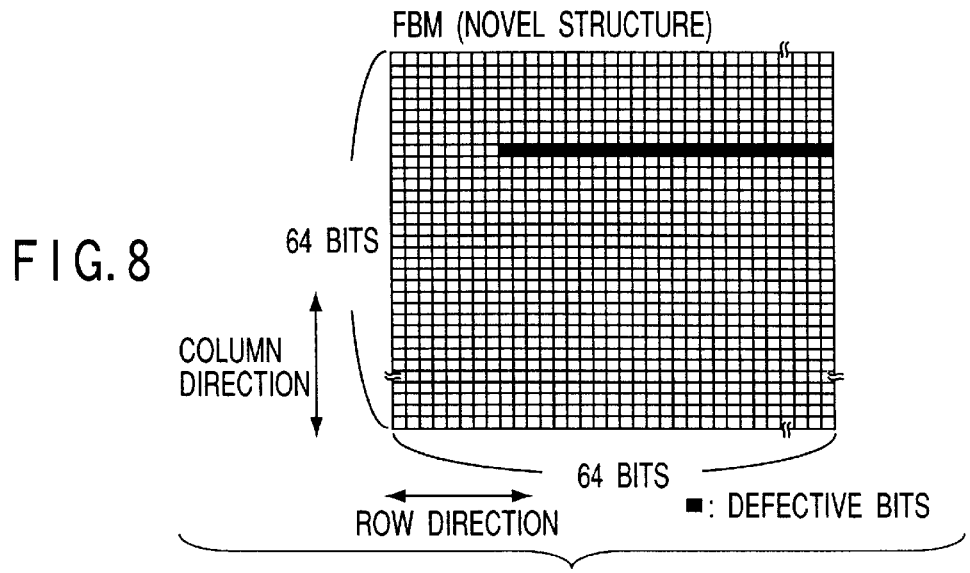
FIG. 8 is a schematic diagram showing the FBM in case the semiconductor device shown in FIG. 7 is used.

FIG. 7 shows a third embodiment of the structure of the word lines formed in the memory cell arrays shown in FIG. 1 and FIG. 2. This embodiment is a modification of the above-mentioned second embodiment.

The word line provided in one row is disposed along a straight line in the row and comprises a plurality of (for example, 8) first wirings 21 extending in the row direction, a plurality of second wirings 22 disposed along a starlight line above the plurality of first wirings 21, and a plurality of fourth wirings 26 disposed along a straight line above the plurality of second wirings 22. The plurality of first wirings are comprised of a first metal layer (for example, a first aluminum layer 1Al), and the plurality of second wirings are comprised of a second metal layer (for example, a second aluminum layer 2Al), and the plurality of fourth wirings are comprised of a third metal layer (for example, a third aluminum layer 3Al) provided above the second metal layer.

Contact plugs (for example, a tungsten layer) 23 connect the plurality of first wirings 21 and the plurality of second wiring 22 to each other. Contact plugs (for example, a tungsten layer) 27 connect the plurality of second wirings 22 and the plurality of fourth wirings 26 to each other. As a result, the plurality of first, second and fourth wirings 21, 22, 26 are connected in series.

Immediately beneath the plurality of first wirings 21, a plurality of third wirings 24 are disposed, extending in the row direction and corresponding to the plurality of first wirings 21 at a rate of 1 to 1. The third wirings 24 are comprised of a polycrystalline silicon layer provided beareth the first metal layer. Contact plugs (for example, a tungsten layer) 25 connect the plurality of first wirings 21 and the plurality of third wirings 24 to each other.

Further, connected to the plurality of third wirings 24 are a plurality of (for example, 8) memory cells which successively range in the row direction.

Disconnections in the contact plugs 23 and 27 which connect the upper and the lower metal layers to each other can be expressed as the successive defects of 8n bits in one row (64 bits). In this case, the disconnection in the contact plugs 23 which connect the first metal layer and the second layer to each other and the disconnection in the contact plugs 27 which connect the second metal layer and the fourth metal layer cannot be distinguished from each other, but, in order to make distinction between these disconnections, it is only necessary to render either one of them into the state in which defects can hardly take place (for example, by taking a measure such as, e.g., increasing the number of contacts in the same location).

Figure 9:
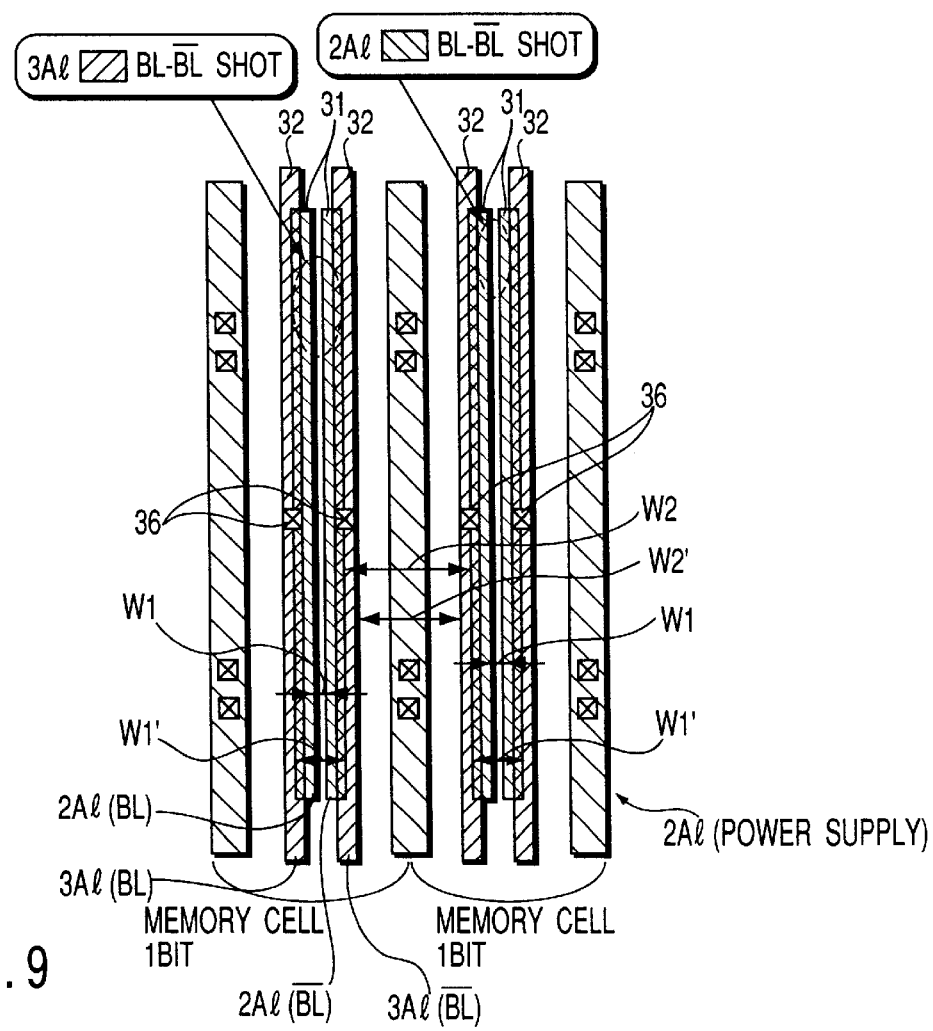
FIG. 9 is a schematic diagram showing a first embodiment of the structure of the bit lines in the memory cell arrays shown in FIG. 1 and FIG. 2.
Figure 10:
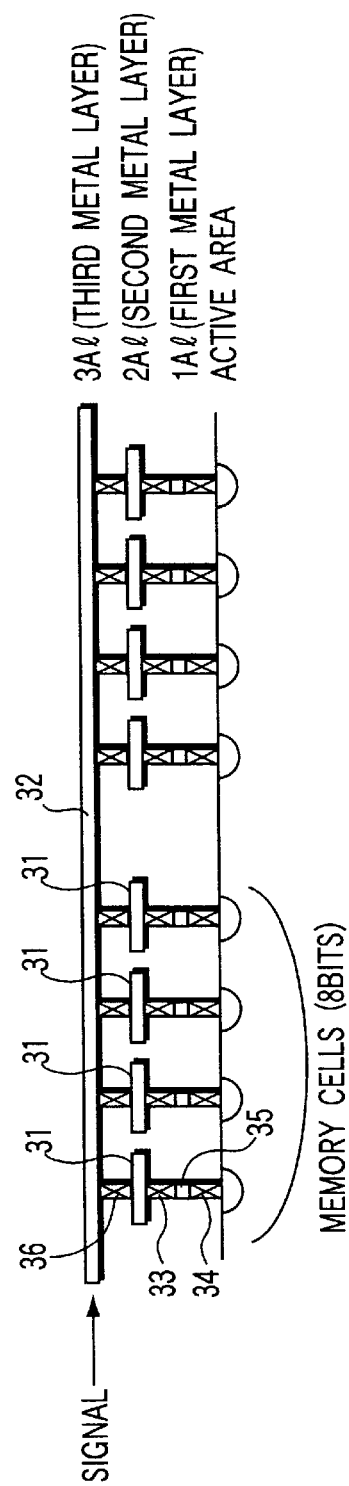
FIG. 10 is a sectional view, in the column direction, of the bit lines shown in FIG. 9.

FIG. 9 shows a first embodiment of the structure of the bit lines formed in the memory cell arrays shown in FIG. 1 and FIG. 2. FIG. 10 is a sectional view of the bit lines shown in FIG. 9.

In one column, two bit lines BL, /BL which extend in the column direction are disposed in parallel to each other. The two bit lines BL, /BL each comprise a plurality of (for example, 32) first wirings 31 disposed along a straight line in one column, and a second wiring 32 disposed above the plurality of first wirings 31. The plurality of first wirings 31 and the second wiring 32 are both comprised of metal layers (for example, aluminum layers 2Al and 3Al).

The plurality of first wirings 31 are connected to the memory cells via contact plugs (for example, tungsten layers) 33, 34 and third wirings (for example, an aluminum layer 1Al) 35. Further, the plurality of first wirings 31 are connected to the second wiring 32 via contact plugs (for example, a tungsten layer) 36, respectively.

That is, to the second wiring 32, all the memory cells in one column are connected.

The intervals W1, W1' (for example, W1=W1') between the two bit lines BL, /BL in one column are set so as to become equal to the intervals (for example, the minimum work dimension by lithography) between the bit lines BL, /BL in the actual semiconductor product. The intervals W2, W2' (W2=W2', for example) between the two bit lines BL, /BL which exist in different columns are larger than the intervals W1, W1'.

Normally, the two bit lines BL, /BL in one column transmits a complementary signal ("1" or "0"), so that, if, in one column, the two first and second wirings 31 and 32 adjacent to each other in the row direction are short-circuited, the transmission of the normal signal cannot be continued; and thus, it is decided that all the memory cells (64 bits) in one column are defective.

Table 4 shows the relationship between the categories and the defective locations or the causes for defects in case defect analysis is made, by the use of the FMB system, of the defect analyzing LSI which has bit lines as shown in FIG. 9 and FIG. 10.

TABLE 4

| | Category | Layer | Node 1 | Node 2 | o/s |
|---|---|---|---|---|---|
| 5 | 1 column (64 bits) is continuously deffective | 3Al | Bit line BL | Bit line /BL | Open |
| 5 | 1 column (64 bits) is continuously deffective | 2Al | Bit line BL | Bit line /BL | Open |

Figure 11:
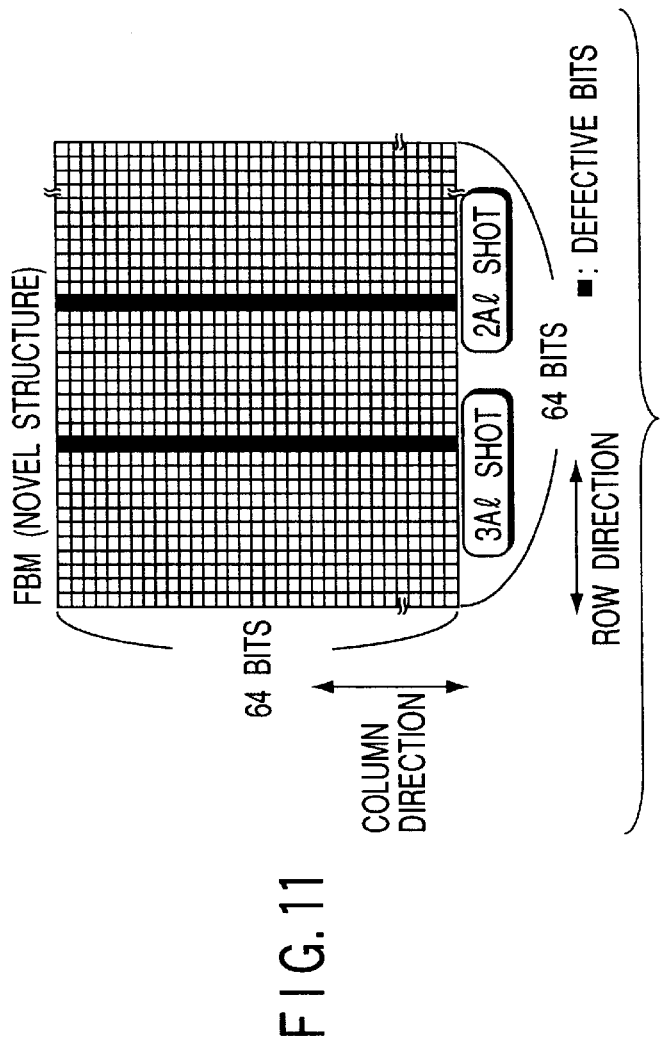
FIG. 11 is a schematic diagram showing the FMB in case the semiconductor device shown in FIG. 9 is used.

According to Item 5 of in Table 4, the short-circuit between the two first wirings (for example, an aluminum layer 2Al) 31 existing in one column in a state adjacent to each other in the row direction appears as the successive defects of one column (64 bits), as shown in the FBM of FIG. 11. That is, if the two first wirings 31 in one column are short-circuited, then all the (64 bits) memory cells existing in the column ceases to operate.

Similarly, the short-circuit between the two second wirings (for example, an aluminum layer 3Al) 32 existing in one column in a state adjacent to each other in the row direction also appears as the successive defects of one column (64 bits). That is, also in case the two second wirings 32 in one column are short-circuited, all the (64 bits) memory cells existing in the column likewise cease to operate.

Thus, if, as shown in Item 5 of Table 4, the categories and the defective locations or the causes for defects are correlated so as to correspond to each other at a rate of 1 to 1, then the short-circuit between the two bit lines Bl, /BL in one column can be easily detected through the analysis of the defect analyzing LSI.

Further, in case of this embodiment, it is impossible to make distinction between the short-circuit of the two first wirings (for example, an aluminum wiring 2Al) in one column and the short-circuit of the two second wirings (for example, an aluminum layer 3Al) 32 in one column.

Figure 12:
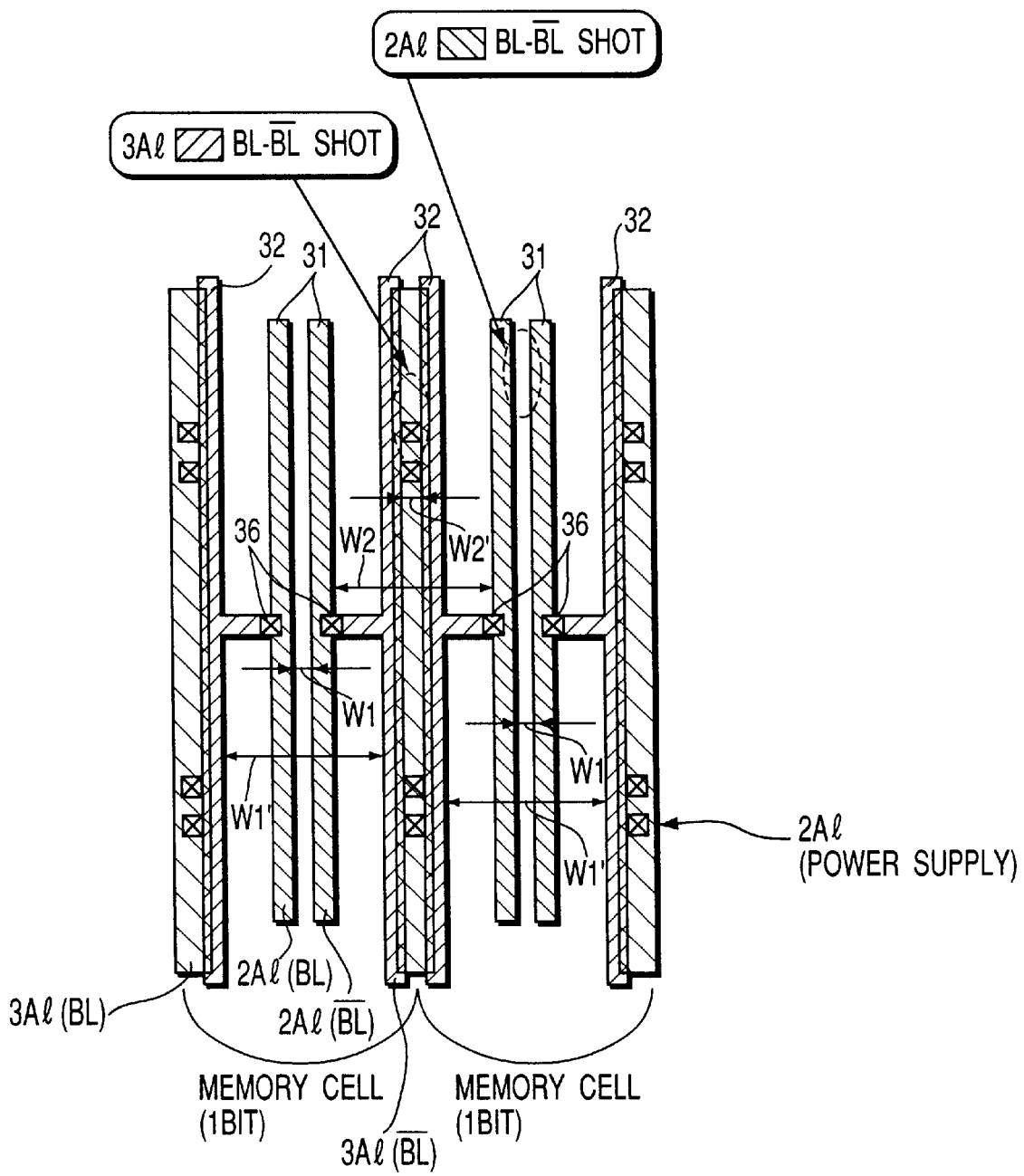
FIG. 12 is a schematic diagram showing a second embodiment of the structure of the bit line in the memory cell arrays shown in FIG. 1 and FIG. 2.

FIG. 12 shows a second embodiment of the structure of the bit lines formed in the memory cells shown in FIG. 1 and FIG. 2. FIG. 13 is a sectional view of the bit lines shown in FIG. 12.

In one column, two bit lines Bl, /BL extending in the column direction are disposed in parallel to each other. The two bit lines BL, /BL are respectively comprised of a plurality of (for example, 32)) first wirings 31 disposed along a straight line and a second wiring 32 disposed above the plurality of first wirings 31. The plurality of first wirings 31 and the second wiring 32 are both comprised of metal layers (for example, aluminum layer 2Al and 3Al).

The plurality of first wirings 31 are each connected to a memory cell via contact plugs (for example, tungsten layers) 33, 34 and a third wiring (for example, an aluminum layer 1Al). Further, the plurality of first wirings 31 are connected to the second wiring 32 via contact plugs (for example, a tungsten layer) 36. In other words, to the second wiring 32, all the memory cells in one column are connected.

The interval W1 between the two first wirings (for example, an aluminum layer 2Al) in one column is set so as to be equal to the interval (for example, the minimum work dimension by lithography) between the bit lines BL, /BL in the actual semiconductor product. The interval W2 between the two first wirings (aluminum layer 2Al) existing in two columns adjacent to each other is larger than the interval W1.

Further, the interval W2', between the two second wirings (aluminum layer 3Al) existing in two columns adjacent to each other is set so as to become equal to the interval (for example, minimum work dimension by lithography) between the bit lines BL, /BL in the actual semiconductor product. The interval W1', between the two second wiring (aluminum layer 3Al) in one column is larger than the interval W2'.

Ordinarily, the two first wirings (bit lines BL, /BL) in one column transmit a complementary signal ("1" or "0"), so that, if the two first wirings 31 adjacent to each other in the row direction in one column are short-circuited, then the normal signal transmission cannot be effected any more, and thus, it is decided that the all the memory cells (64 bits) in one column are defective.

Further, in case the two second wirings (bit lines BL, /BL) existing in the two columns adjacent to each other are short-circuited, the normal signal transmission cannot be effected any more in the two columns; and thus, it is decided that all the memory cells (64 bits) in the two columns are defective.

Table 5 shows the relationship between the categories and the defective locations or the causes for defects in case defect analysis is made, by the use of the FMB system, of the defect analyzing LSI having bit lines as shown in FIG. 12 and FIG. 13.

TABLE 5

| Category | Layer | Node 1 | Node 2 | o/s |
|---|---|---|---|---|
| 5 2 columns (64 × 2 bits) are continuously deffective | 3Al | Bit line BL | Bit line $\overline{BL}$ | open |
| 5 1 column (64 bits) is continuously deffective | 2Al | Bit line BL | Bit line $\overline{BL}$ | open |

According to Item 5 of Table 5, as shown in the FBM of FIG. 14, the short-circuit between the two first wirings (for example, an aluminum layer 2Al) adjacent to each other in the row direction in one column is expressed as the successive defects of one column (64 bits). In other words, if the two first wirings 31 in one column are short-circuited, then all the (64 bits) memory cells existing in the column cease to operate.

Further, if the two second wirings (for example, aluminum layer 3Al) existing in the two columns adjacent to each other are short-circuited, then it is expressed, in the FBM, as the successive defects of the two columns (64×2 bits). In other words, if the two second wirings 32 existing in two columns adjacent to each other are short-circuited, then all the (64×2 bits) memory cells existing in the two columns do not operate any more.

Thus, if the categories and the defective locations or the causes for defects are correlated so as to correspond to each other at a rate of 1 to 1 as shown in Item 5 of Table 5, then the short-circuit of the two bit lines BL, /BL in one column can be easily detected by the analysis of the defect analyzing LSI.

As stated above, according to this embodiment, it is possible to make distinction between the short-circuit of the two first wirings (for example, an aluminum layer 2Al) and the short-circuit of the two second wirings (for example, an aluminum layer 3Al).

Figure 15:
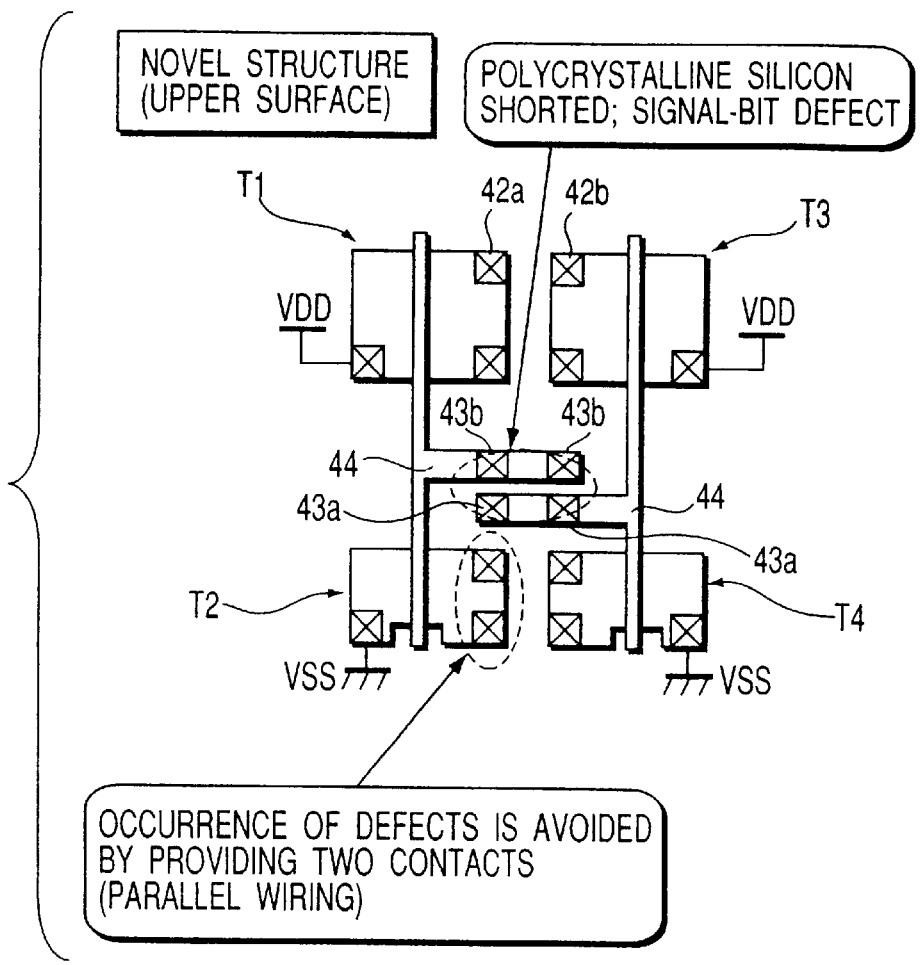
FIG. 15 is a schematic diagram showing an example of the structure of the memory cell portion in the memory cell array shown in FIG. 1 and FIG. 2.
Figure 16:
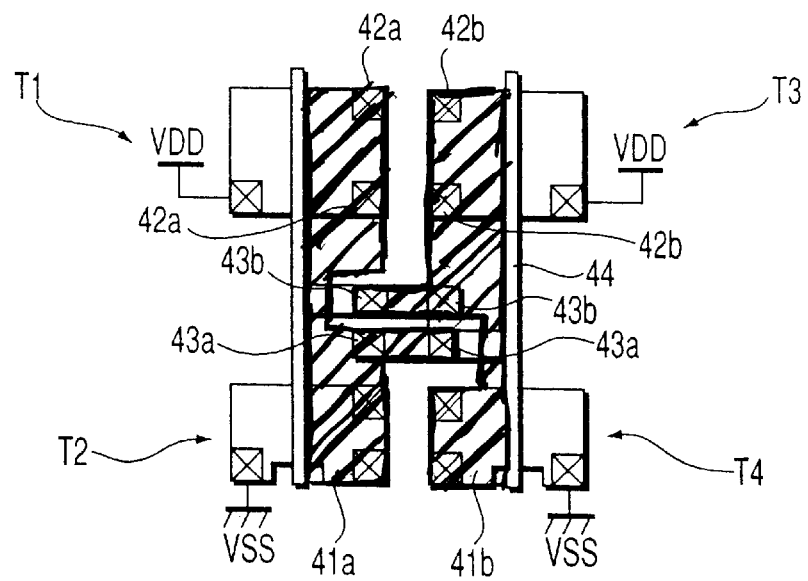
FIG. 16 is a schematic diagram showing the metal layer above the memory cell portion shown in FIG. 15.
Figure 17:
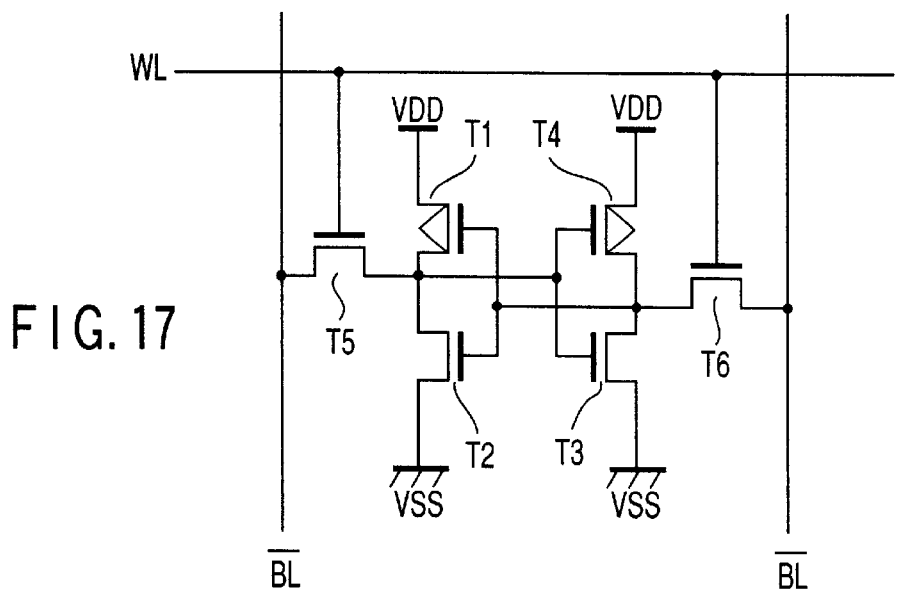
FIG. 17 is an equivalent circuit of the device shown in FIG. 15.

FIG. 15 shows the structure of the memory cell portion formed in the memory cell arrays shown in FIG. 1 and FIG. 2. FIG. 16 shows the metal layers (hatched portions such as 1Al) formed above the memory cell portion shown in FIG. 15. FIG. 17 is an equivalent circuit diagram of the device shown in FIG. 15.

In this embodiment, the present invention is applied to a defect analyzing LSI (SRAM-TEG (Test Element Group)) which has SRAM cell arrays.

MOS transistors T1, T2 are connected between a power supply VDD and a power supply (earth point) VSS, constituting a first inverter. MOS transistors T3, T4 are connected between the power supply VDD and the power supply (earth point) VSS, constituting a second inverter. The first and the second inverters are flip-flop-connected.

The gates of the MOS transistors T1, T2 are comprised of a polycrystalline silicon layer 44, and the gates of the MOS transistors T3, T4 are likewise comprised of a polycrystalline silicon layer 44. A portion of the interval between the gates of the MOS transistors Ti, T2 and the gates of the MOS transistors T3, T4 is set to the minimum work dimension in lithography.

In FIG. 15 and FIG. 16, the transfer transistors T5, T6 are omitted. The transfer transistors T5, T6 are disposed adjacent, for instance, to the MOS transistors T1, T3 which constitute memory cells; and the transfer transistors T5, T6 are connected between the bit lines BL, /BL and the drains of the MOS transistors T1, T3.

The structure of the memory cell portion according to this embodiment differs from the conventional structure in that, in the former, there are provided two contact plug 42a which connect together the drains of the MOS transistors T1, T2 and a first wiring 41a comprised of, for example, a metal layer, and further, there are provided two contact plugs 43a which connect the gates of the MOS transistors T3, T4 and the first wiring 41a.

Similarly, there are provided two contact plugs 42b which connect together the drains of the MOS transistors T3, T4 and a wiring 41b comprised of, for example, a metal layer, and further, there are provided two contact plugs 43b which connect the gates of the MOS transistors T1, T2 and the wiring 41b.

In other words, by providing two contact portions with respect to the one diffusion layer (drains) of the MOS transistors T1 to T4, it is ensured to prevent the occurrence of a defect due to the disconnection of the contact plugs 42a, 42b with respect to the active area (SDG area) of the SRAM cells.

Further, by providing two contact portions with respect to the MOS transistors T1 to T4, it is ensured to prevent the occurrence of a defect due to the disconnection of the contact plugs 43a, 43b with respect to the polycrystalline silicon layer in the SRAM cells.

The wiring 41a is provided for connecting the drains of the MOS transistors T1, T2 and the gates of the MOS transistors T3, T4 to each other, while the wiring 41b is provided for connecting the drains of the MOS transistors T3, T4 and the gates of the MOS transistors T1, T2 to each other.

As a result, only the short-circuit of the polycrystalline silicon layer 44 in the SRAM cells is represented as belonging to a predetermined category (single-bit defect), so that the short-circuit of the polycrystalline silicon layer 44 in the SRAM cells can be detected separately from the disconnection of the contact plugs with respect to the active area (SDC area) of the SRAM cells and the disconnection of the contact plugs with respect to the polycrystalline silicon layer in the SRAM cells.

Table 6 shows the relationship between the categories and the defective locations or the causes for defects in case defect analysis is made, by the use of the FBM system, of the defect analyzing LSI having the memory cells shown in FIG. 15 and FIG. 16.

TABLE 6

| | Category | Layer | Node 1 | Node 2 | o/s |
|---|---|---|---|---|---|
| 3 | single-bit defect | Polycrystalline silicon | Internal wiring | Internal wiring | short |

Figure 18:
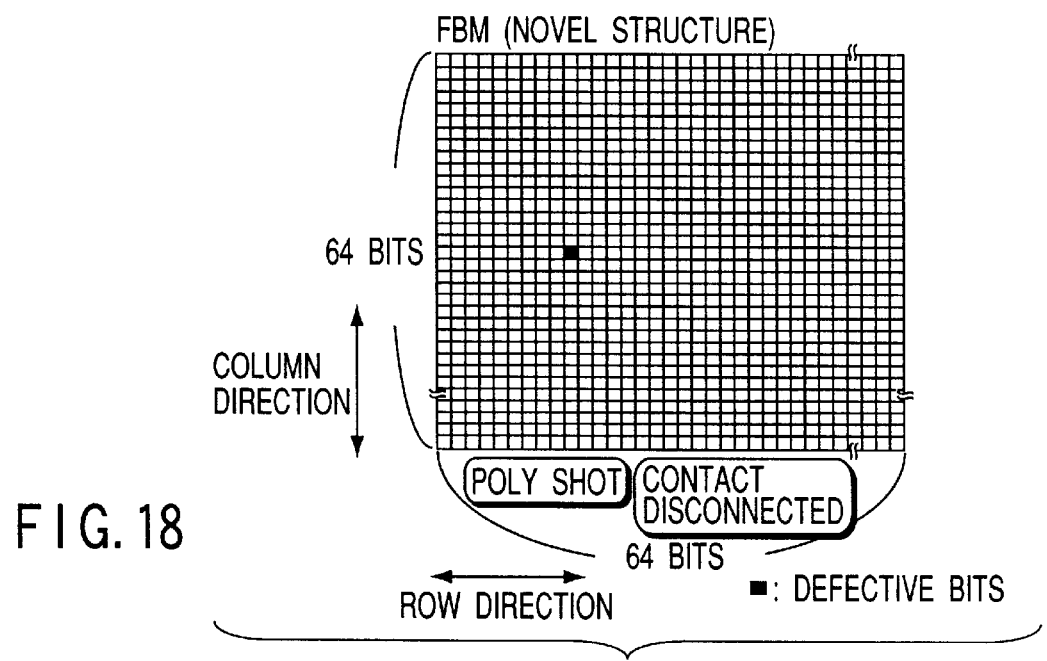
FIG. 18 is a schematic diagram showing the FBM in case the semiconductor device shown in FIG. 15 is used.
Figure 19:
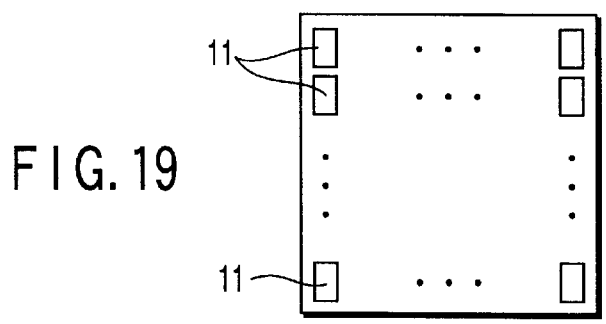
FIG. 19 is a schematic diagram showing an outline of a conventional semiconductor device.
Figure 20:
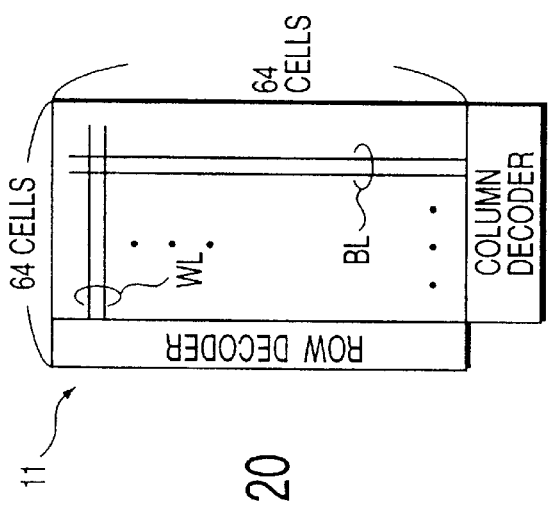
FIG. 20 is a schematic diagram showing the memory cell array shown in FIG. 19.
Figure 21:
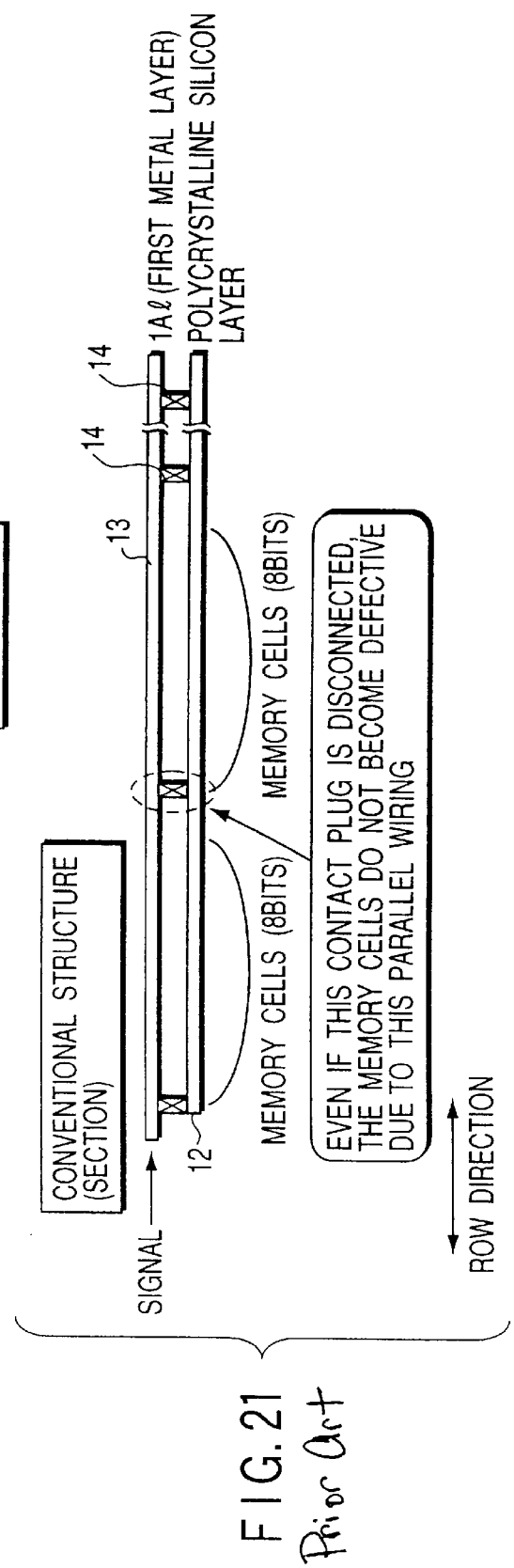
FIG. 21 is a schematic diagram showing an example of the structure of the word lines in the memory cell array shown in FIG. 19 and FIG. 20.
Figure 22:
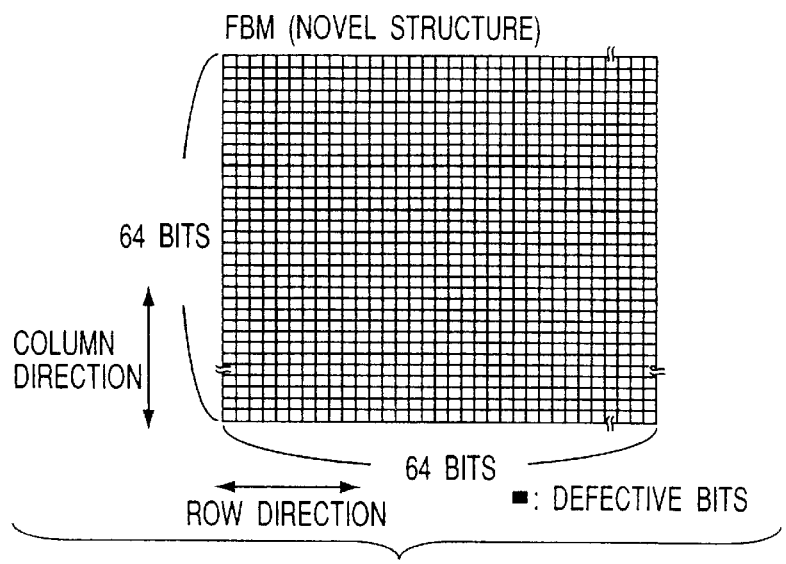
FIG. 22 is a schematic diagram showing the FBM in case the semiconductor device shown in FIG. 21 is used.
Figure 23:
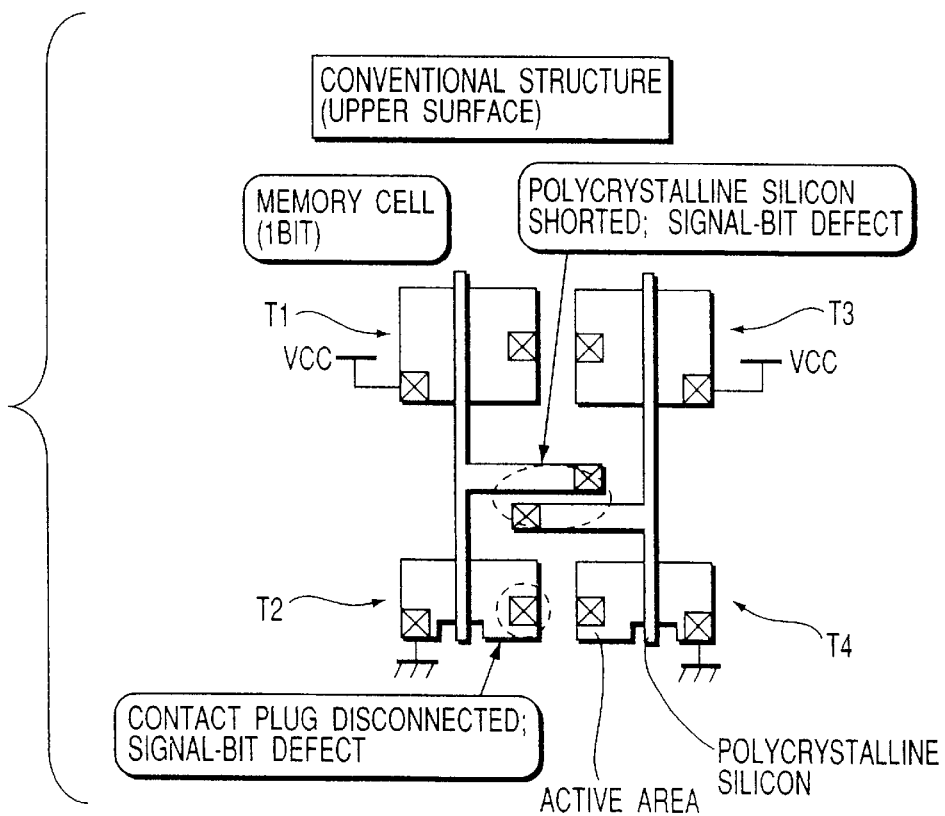
FIG. 23 is a schematic diagram showing an example of the structure of the memory cell portion in the memory cell array shown in FIG. 18 and FIG. 19.
Figure 24:
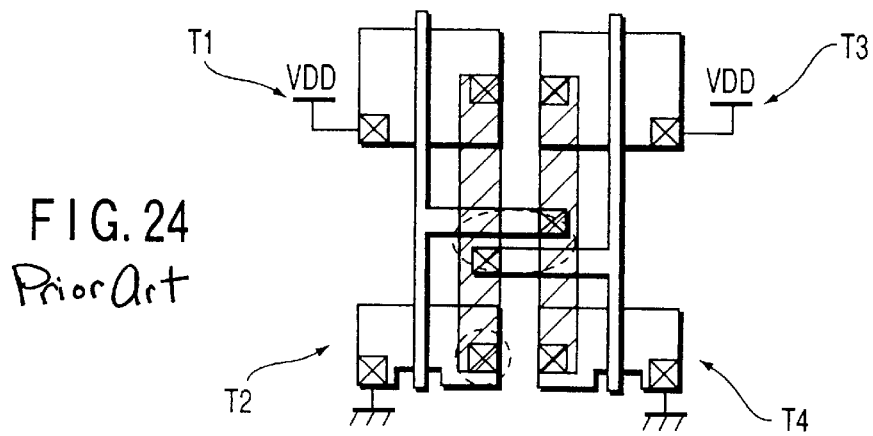
FIG. 24 is a schematic diagram showing the metal layer above the memory cell portion shown in FIG. 23.
Figure 25:
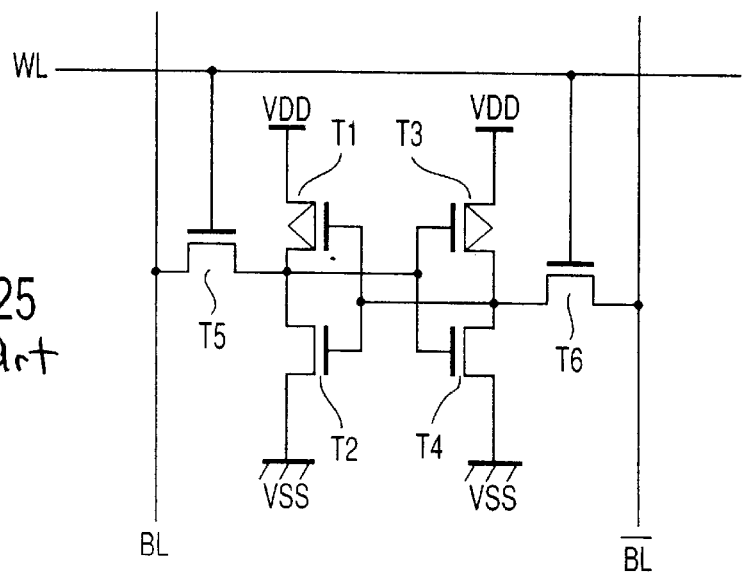
FIG. 25 is an equivalent circuit of the device shown in FIG. 23.
Figure 26:
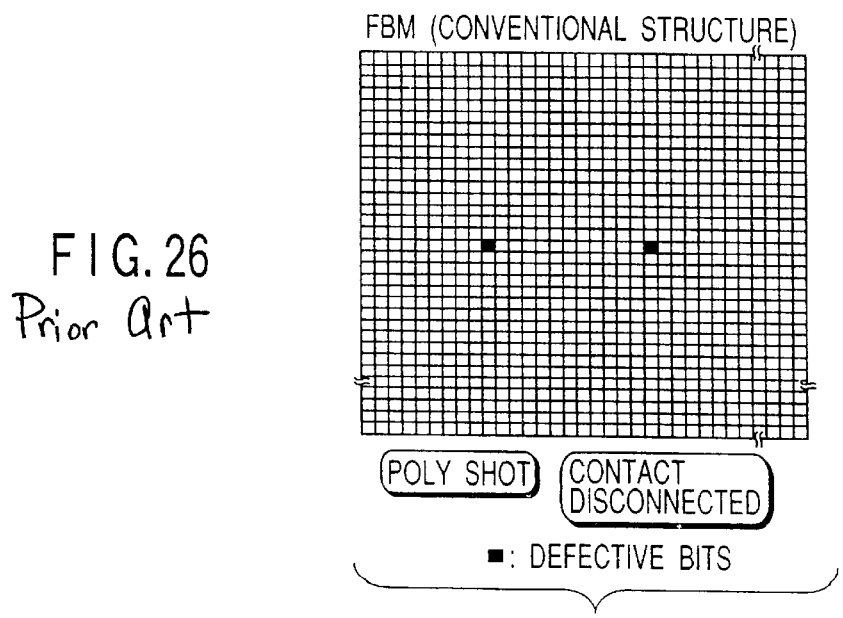
FIG. 26 is a schematic diagram showing the FBM in case the semiconductor device shown in FIG. 23 is used.

According to Item 3 of Table 6, only the short-circuit of the polycrystalline silicon layer in the SRAM cells can be represented as a single-bit defect as shown in the FBM of FIG. 18.

Further, there is a very low probability that the disconnection of the contact plugs with respect to the active area (SDG area) of the SRAM cells and the disconnection of the contact plugs with respect to the polycrystalline silicon layer in the SRAM cells take place; and thus, it may be considered that these defects do substantially not take place.

By the way, some of the above-mentioned embodiments can be combined into one defect analyzing LSI. For example, by the use of one of the word lines shown in FIG. 3, FIG. 5 and FIG. 7, one of the bit lines shown in FIG. 9 and FIG. 12, and the memory cells shown in FIG. 15, one defect analyzing LSI can be constituted.

That is, by utilizing the multi-layer wirings (the polycrystalline silicon layers and the first to third metal layers), it never happen in any combination that the wirings cross each other in one and the same layer.

As described above, according to the present invention, a plurality of different defects can be easily detected as belonging to different categories in case a defect analyzing LSI having memory cells is periodically manufactured to perform defect analysis by the use of the FBM system; and therefore, the defective locations can be easily specified or the causes for defects can be easily cleared up, and process feedback can be easily effected. The present invention can thus contribute to the enhancement in the manufacturing yield of semiconductor products.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A defect analyzing semiconductor device comprising:

memory cell arrays;

a plurality of first wirings disposed serially and lengthwise along a first straight line in one row or one column of the memory cell arrays;

a single second wiring disposed lengthwise along a second straight line above the plurality of first wirings for transmitting a signal from one end of the second wiring to the other end thereof, wherein the plurality of first wirings and the second wiring extend lengthwise in a same direction; and a plurality of contact plugs which connect the plurality of first wirings to the second wiring, respectively;

wherein the plurality of first wirings are each connected to a plurality of successive memory cells among all the memory cells in the row or the column to which the plurality of first wirings each belong.

2. A defect analyzing semiconductor device comprising:

memory cell arrays;

a plurality of first wirings disposed serially and lengthwise along a first straight line in one row or one column of the memory cell arrays;

a plurality of second wirings disposed serially and lengthwise along a second straight line above the plurality of first wirings, wherein the plurality of first wirings and the second wiring extend lengthwise in a same direction;

a plurality of third wirings; and a plurality of contact plugs, wherein each of the plurality of first wirings is connected to a corresponding one of the plurality of second wirings through one of the plurality of contact plugs, wherein each of the plurality of third wirings connects two adjacent ones of the plurality of second wirings through ones of the plurality of contact plugs, and wherein the plurality of first wirings are each connected to a plurality of successive memory cells among all the memory cells in the row or the column to which the plurality of first wirings each belong.

3. A defect analyzing semiconductor device comprising:

memory cell arrays;

two first wirings which are disposed in one column of the memory cell arrays, and to which signals complementary to each other are applied;

two second wirings disposed above the two first wirings; and a plurality of contact plugs which connect one of the two first wirings to one of the two second wirings and connect the other of the two first wirings to the other of the two second wirings;

wherein the two first wirings are connected to all the memory cells in the column to which the two first wirings each belong, and wherein an interval between the two first wirings is smaller than an interval between the first wiring in one of two columns adjacent to each other and the first wiring in the other column, while an interval between the two second wirings is smaller than an interval between the second wiring in one of two columns adjacent to each other and the second wiring in the other column.

4. A defect analyzing semiconductor device comprising:

memory cell arrays;

two first wirings which are disposed in one column of the memory cell arrays and to which signals complementary to each other are applied;

two second wirings disposed above or beneath the two first wirings; and a plurality of contact plugs which connect one of the two first wirings to one of the two second wirings and connect the other one of the two first wirings to the other one of the two second wirings;

wherein the two first or second wirings are connected to all the memory cells in the column to which the two first or second wirings each belong, wherein an interval between the two first wirings is smaller than an interval between the first wiring in one of two columns adjacent to each other and the first wiring in the other column, while an interval between the second wirings is larger than an interval between the second wiring in the other column.

5. A defect analyzing semiconductor device comprising:

first and second MOS transistors which are connected in series between first and second power supplies, and constitute a first inverter;

third and fourth MOS transistors which are connected in series between the first and second power supplies, constitute a second inverter, and are flip-flop-connected to the first inverter;

a first wiring which connects the drains of the first and second MOS transistors and the gates of the third and fourth MOS transistors to each other; and a second wiring which connects the drains of the third and fourth MOS transistors and the gates of the first and second MOS transistors to each other;

wherein the contact portion between the drains of the third and fourth MOS transistors and the first wiring, the contact portion between the gates of the first and second MOS transistors and the first wiring, the contact portion between the drains of the third and fourth MOS transistors and the second wiring, and the contact portion between the gates of the first and second MOS transistors and the second wiring are each provided at two or more locations, and wherein a portion of the interval between the gates of the first and second MOS transistors and the gates of the third and fourth MOS transistors is set to a minimum work dimension.

* * * * *

UNITED STATES PATENT AND TRADEMARK OFFICE
CERTIFICATE OF CORRECTION

PATENT NO. : 6,740,979 B1  Page 1 of 1
DATED : May 25, 2004
INVENTOR(S) : Tamura It is certified that error appears in the above-identified patent and that said Letters Patent is hereby corrected as shown below:

<u>Title page,</u>
Item [54], Title, delete "METHOD USING THE SAME".

Signed and Sealed this

Twenty-seventh Day of July, 2004

JON W. DUDAS
*Acting Director of the United States Patent and Trademark Office*